(12) United States Patent
Odaka et al.

(10) Patent No.: US 9,478,594 B2
(45) Date of Patent: Oct. 25, 2016

(54) ORGANIC ELECTROLUMINESCENCE DISPLAY DEVICE AND METHOD OF MANUFACTURING ORGANIC ELECTROLUMINESCENCE DISPLAY DEVICE

(71) Applicant: Japan Display Inc., Tokyo (JP)

(72) Inventors: Kazuhiro Odaka, Tokyo (JP); Toshihiro Sato, Tokyo (JP); Naoki Tokuda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/489,550

(22) Filed: Sep. 18, 2014

(65) Prior Publication Data

US 2015/0076476 A1   Mar. 19, 2015

(30) Foreign Application Priority Data

Sep. 19, 2013   (JP) ................. 2013-194351

(51) Int. Cl.
| | |
|---|---|
| H01L 21/00 | (2006.01) |
| H01L 27/32 | (2006.01) |
| H01L 51/56 | (2006.01) |
| H01L 51/00 | (2006.01) |
| H01L 51/52 | (2006.01) |

(52) U.S. Cl.
CPC ....... *H01L 27/3258* (2013.01); *H01L 27/3246* (2013.01); *H01L 51/0018* (2013.01); *H01L 51/5203* (2013.01); *H01L 51/56* (2013.01)

(58) Field of Classification Search
CPC ........... H01L 27/3258; H01L 51/0018; H01L 51/5203; H01L 51/56

USPC ..... 257/40, E51.018; 438/29, 34, 42, 43, 99
See application file for complete search history.

(56) References Cited

U.S. PATENT DOCUMENTS

| | | | |
|---|---|---|---|
| 2005/0110023 A1* | 5/2005 | Lee ..................... | H01L 27/3276 257/72 |
| 2009/0128023 A1* | 5/2009 | Kwak ................. | H01L 27/3246 313/504 |
| 2011/0215329 A1* | 9/2011 | Chung .................. | H01L 27/326 257/59 |

FOREIGN PATENT DOCUMENTS

JP   2004-342455 A   12/2004

* cited by examiner

*Primary Examiner* — Robert Huber
(74) *Attorney, Agent, or Firm* — Typha IP LLC

(57) ABSTRACT

Steps for manufacturing an organic electroluminescent display device that can form an electrode pattern with high precision include forming a first insulating layer on a substrate and forming a first patterning layer, and forming a second patterning layer. The steps for manufacturing the organic electroluminescent display device further include forming a trench portion and forming an electrode layer on the second patterning layer and in the trench portion. In the step of forming the trench portion, an end of the first patterning layer exposed within the trench portion is etched to an outside more than an end of the second patterning layer exposed within the trench portion in a plan view, and in the step of forming the electrode layer, the electrode layer formed within the trench portion is isolated from the electrode layer formed outside of the trench portion.

14 Claims, 17 Drawing Sheets

ORGANIC ELECTROLUMINESCENCE DISPLAY DEVICE AND METHOD OF MANUFACTURING ORGANIC ELECTROLUMINESCENCE DISPLAY DEVICE

CROSS-REFERENCE TO RELATED APPLICATION

The present application claims priority from Japanese application JP 2013-194351 filed on Sep. 19, 2013, the content of which is hereby incorporated by reference into this application.

BACKGROUND OF THE INVENTION

1. Field of the Invention

The present invention relates to an organic electroluminescent display device, and a method of manufacturing the organic electroluminescent display device.

2. Description of the Prior Art

As thin and lightweight displays, an organic electroluminescent display device (hereinafter referred to as "organic EL display device") using organic electroluminescent elements (hereinafter referred to as "organic EL elements") has been developed. The organic EL elements each have a structure in which an organic layer having a light emitting layer is sandwiched between a pixel electrode and a counter electrode. Also, in the organic EL display device, a frame area that is an area around a display area in which an image is displayed is required to be narrowed.

In manufacturing the organic EL display device of this type, a matrix-shaped electrode is formed in the display area with the use of a mask. The mask of this type has openings formed in a matrix, and a shielding portion disposed in a lattice pattern in correspondence with the frame areas. After the electrode has been formed, a substrate is cut along the respective frame areas to form singulated organic EL display devices.

Also, as another manufacturing method, JP 2004-342455 A discloses a method in which a substrate on which a film has been formed is irradiated with a laser by a manufacturing device added with a laser processing chamber to form a film having a desired pattern.

SUMMARY OF THE INVENTION

In recent years, the frame area has been required to be narrowed with a reduction in the size of the organic EL display device. However, as a width of the shielding portion of the mask is narrowed more in association with the narrowed frame of the frame area, the mask is easily deformed by a stress in forming a film of the electrode. For that reason, there is a risk that a precision in formation of the electrode pattern may be degraded due to the film formation using the mask.

Also, according to the above film forming method, the laser processing chamber needs to be added to the conventional manufacturing device. This makes it difficult to suppress the manufacturing costs of the organic EL display device. Also, because a process of laser processing is added in forming the electrode film, the number of processes increases. For that reason, it is difficult to facilitate the formation of the electrode pattern.

The present invention has been made in view of the above circumstances, and therefore aims at realizing a method of manufacturing an organic electroluminescent display device that can form an electrode pattern with high precision.

(1) According to the present invention, there is provided a method of manufacturing an organic electroluminescent display device, including the steps of: forming a first insulating layer on a substrate having a rectangular display area and a frame area which surrounds an outer periphery of the display area; forming a first patterning layer on the first insulating layer; forming a second patterning layer on the first patterning layer; removing a part of the second patterning layer and the first patterning layer in the frame area to form a trench portion; and forming an electrode layer on the second patterning layer and in the trench portion, in which in the step of forming the trench portion, an end of the first patterning layer exposed within the trench portion is etched to an outside more than an end of the second patterning layer exposed within the trench portion in a plan view, in which in the step of forming the electrode layer, the electrode layer formed within the trench portion which is located on a lower side of the end of the first patterning layer is isolated from the electrode layer formed outside of the trench portion, which is located on an upper side of the end of the first patterning layer.

(2) According to the present invention, in the method of manufacturing the organic electroluminescent display device according to the item (1), the display area is arrays in a matrix on the substrate, the trench portion is formed along an outer periphery of the display area in the plan view, the frame area is cut along the trench portion after the electrode layer is formed to divide the substrate into a plurality of pieces.

(3) According to the present invention, the method of manufacturing the organic electroluminescent display device according to the item (1) further comprises the step of forming a ground in the frame area of the substrate before the step of forming the first insulating layer, in which in the step of forming the trench portion, the ground is exposed within the trench portion, and in the step of forming the electrode layer, the electrode layer is connected to the ground exposed within the trench portion.

(4) According to the present invention, in the method of manufacturing the organic electroluminescent display device according to the item (1), at least a part of a plurality of the trench portions are aligned at intervals from each other, and in the step of forming the electrode layer, the electrode layer formed in the part of trench portion is isolated from the electrode layer formed between the part of trench portions to form the terminal having the electrode layer within the part of trench portion.

(5) According to the present invention, in the method of manufacturing the organic electroluminescent display device according to the item (1), the second patterning layer is a pixel electrode layer, and the electrode layer is a counter electrode layer facing the pixel electrode layer.

(6) According to the present invention, in the method of manufacturing the organic electroluminescent display device according to the item (1), in the step of forming electrode layer, a material of the electrode layer is deposited on the second patterning layer with the use of a mask having a shielding portion extending in only one direction in correspondence with a part of the frame area to form an area in which the electrode layer is not formed in a part of the frame area.

(7) According to the present invention, there is provided an organic electroluminescent display device including: a substrate having a rectangular display area and a frame area which surrounds an outer periphery of the display area; a first insulating layer that is formed on the substrate; a first patterning layer that is formed on the first insulating layer; a second patterning layer that is formed on the first patterning layer; a trench portion that is formed in the frame area, and from which a part of the second patterning layer and the first patterning layer are removed; and an electrode layer that is formed on the second patterning layer and within the trench portion, in which an end of the first patterning layer exposed within the trench portion is located on an outside of an end of the second patterning layer exposed within the trench portion in a plan view, and the electrode layer that is located on a lower side of the end of the first patterning layer and formed within the trench portion is isolated from the electrode layer located on an upper side of the end of the first patterning layer and formed in a periphery of the trench portion.

According to the method of manufacturing the organic electroluminescent display device in the present invention, because an arbitrary portion of the electrode layer can be electrically isolated without any mask, a conductive pattern of the electrode layer can be formed with high precision.

DETAILED DESCRIPTION OF THE INVENTION

Hereinafter, a description will be given of an organic EL display device 1$a$ according to an embodiment of the present invention with reference to the accompanying drawings. The drawings referred to in the following description may illustrate an enlarged portion of the features for convenience in order to facilitate understanding of the features, and the size ratio of the respective components is not always identical with a real one. Also, the materials exemplified in the following description are exemplary, and the respective components may be made of materials different from the exemplified materials, and can be implemented with changes without departing from the spirit thereof.

Figure 1:
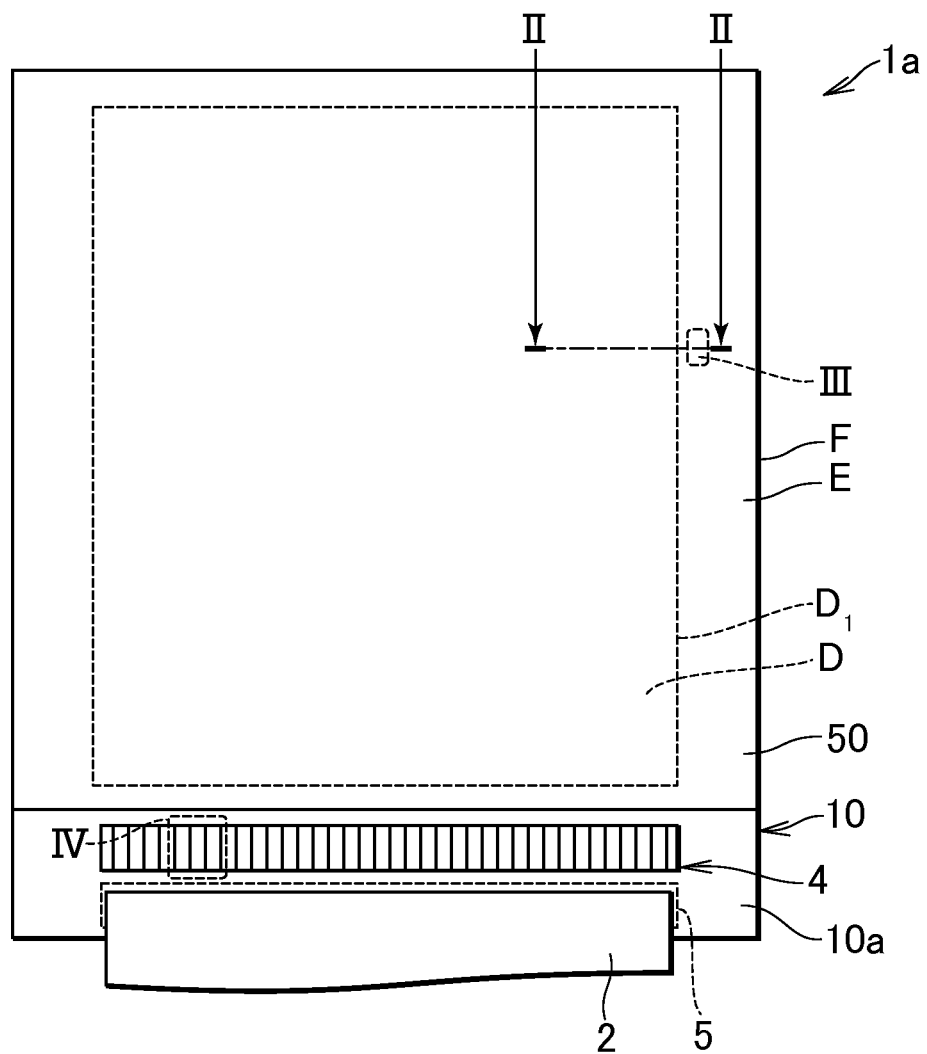
FIG. 1 is a schematic plan view of an organic EL display device according to an embodiment of the present invention.

FIG. 1 is a schematic plan view of an organic EL display device 1$a$ according to an embodiment of the present invention. The organic EL display device 1$a$ includes a substrate 10, a flexible wiring substrate 2, a first terminal 4, and thin film transistors 11, a first insulating layer 12, a first patterning layer 13, organic EL elements 30, and a sealing film 40 which will be described later, and a counter substrate 50.

The substrate 10 includes a display area D rectangular in a plan view, and a frame area E located to surround an outer periphery $D_1$ of the display area D.

A counter substrate 50 is arranged on an upper surface 10$a$ of the substrate 10 so as to face the substrate 10. As illustrated in FIG. 1, the flexible wiring substrate 2 and plural first terminals 4 are disposed in an area where the counter substrate 50 is not arranged on the upper surface 10$a$ of the substrate 10. The flexible wiring substrate 2 is a member for supplying image data to an IC (integrated circuit) chip (not shown) that is connected to the first terminals 4 from an external of the organic EL display device 1$a$.

The first terminals 4 are electronic components electrically connected to the flexible wiring substrate 2 or an external device such as an IC chip. In this embodiment, the first terminals 4 are disposed in a connection area of the IC chip not shown and the substrate 10. Also, second terminals 5 having the same configuration as that of the first terminals 4 are disposed in a connection area of the flexible wiring substrate 2 and the substrate 10.

The plural first terminals 4 and the plural second terminals 5 are each arranged at intervals from each other. The first terminals 4 receive image data from the external, and supply voltage signals to be applied to respective pixels to the organic EL elements 30 to be described later through an IC chip not shown.

Figure 2:
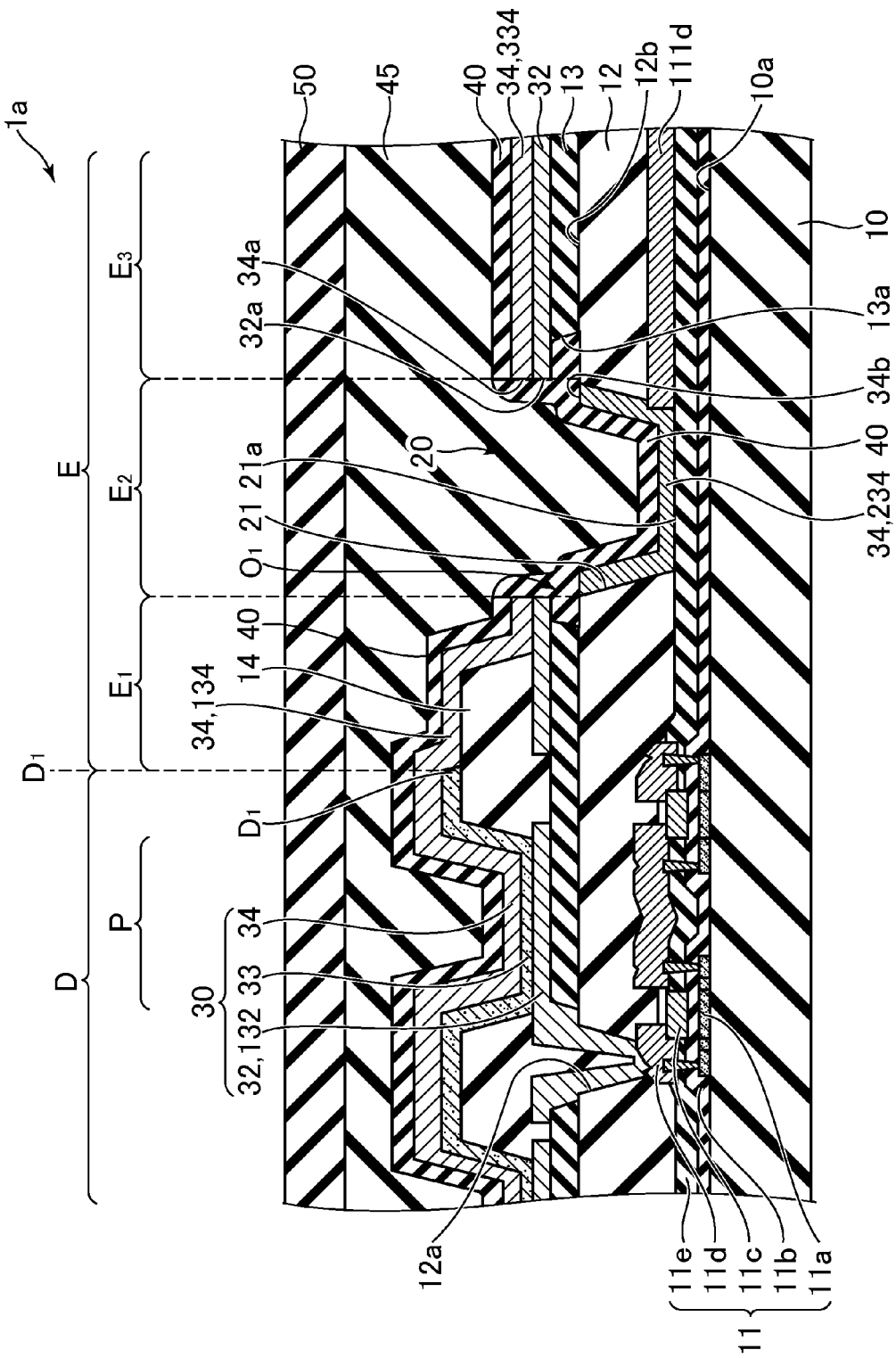
FIG. 2 is a schematic cross-sectional view taken along a line II-II of the organic EL display device illustrated in FIG. 1.

FIG. 2 is a schematic cross-sectional view taken along a line II-II of the organic EL display device illustrated in FIG. 1. FIG. 2 illustrates a cross-section of a neighborhood of a boundary $D_1$ between the display area D and the frame area E. Hereinafter, for convenience of description, the respective configurations of the display area D and the frame area E will be described in order in detail.

The display area D is an area in which an image is displayed. The organic EL elements 30 are formed in the display area D. The thin film transistors 11 are formed on the display area D of the substrate 10. The first insulating layer 12, the first patterning layer 13, the organic EL element 30, and the sealing film 40 are formed on each of the thin film transistors 11.

The thin film transistor 11 drives the organic EL element 30. The thin film transistor 11 is disposed on the substrate 10 for each of pixels P. The thin film transistor 11 includes a polysilicon semiconductor layer 11a, a gate insulating layer 11b, a gate electrode 11c, a source/drain electrode 11d, and an interlayer insulating film 11e.

The first insulating layer 12 is an insulating layer made of, for example, an organic material. The first insulating layer 12 is disposed to cover the thin film transistor 11. The first insulating layer 12 in the display area D is disposed between the thin film transistor 11 and the organic EL element 30 to electrically isolate the respective adjacent thin film transistors 11 from each other, and the thin film transistor 11 from the organic EL element 30. The provision of the first insulating layer 12 on the thin film transistor 11 flattens an area in which the organic EL element 30 to be described later is formed.

The first patterning layer 13 in the display area D functions as a passivation film. The first patterning layer 13 is made of a material having an insulating property such as $SiO_2$, SiN, acrylic, or polyimide, and formed to cover the first insulating layer 12.

Also, a contact hole 12a that electrically connects the thin film transistor 11 to the organic EL element 30 is formed in the first patterning layer 13 in the display area D for each of the organic EL elements 30.

A reflective film not shown may be formed in an area corresponding to each of the pixels P on the first patterning layer 13. The reflecting film is disposed to reflect light emitted from the organic EL element 30 toward the counter substrate 50 side. The reflecting film is more preferable as the optical reflectance is higher, and can be formed of a metal film made of aluminum or silver (Ag).

The plural organic EL elements 30 are formed on the first patterning layer 13 in correspondence with the respective pixels P. The organic EL element 30 includes a pixel electrode layer (second patterning layer) 32, an organic layer 33 having at least a light emitting layer, and a counter electrode layer (electrode layer) 34 laminated to cover the organic layer 33 to function as a light emitting source.

The second patterning layer 32 in the display area ID functions as a pixel electrode layer that injects a drive current into the organic layer 33. Hereinafter, the second patterning layer 32 in the display area D is called a pixel electrode layer 132. The pixel electrode layer 132 is formed in the display area D of the substrate 10 for each of the pixels P. The pixel electrode layer 132 is connected to the first contact hole 12a. With this configuration, the pixel electrode layer 132 is electrically connected to the thin film transistor 11, and supplied with a drive current from the thin film transistor 11.

The pixel electrode layer 132 (second patterning layer 32) is made of a material having a conductive property. Specifically, it is preferable that the pixel electrode layer 132 is made of, for example, ITO (indium tin oxide). Alternatively the pixel electrode layer 132 may be made of a material having translucency and conductivity such as IZO (indium zinc oxide composite), tin oxide, zinc oxide, indium oxide, or aluminum oxide composite oxide. The reflecting film is made of metal such as silver, and when the reflecting film is configured to come in contact with the pixel electrode layer 132, the reflecting film functions as a part of the pixel electrode layer 132.

A pixel separation film 14 is formed between the respective pixel electrode layers 132 adjacent to each other along the boundary between the respective pixels P adjacent to each other. The pixel separation film 14 prevents contact of the respective pixel electrode layers 132 adjacent to each other, and a leakage current between the pixel electrode layer 132 and the counter electrode layer 34. The pixel separation film 14 is made of an insulating material, and specifically made of, for example, a photosensitive resin composition.

The organic layer 33 is a layer having at least the light emitting layer which is made of an organic material. The organic layer 33 is formed to contact with the pixel electrode layer 32. The organic layer 33 may be formed for each of the pixels P. Also, the organic layer 33 may be formed to cover an overall surface of the area in which the pixels P are arranged in the display area D. The organic layer 33 has a layer that emits light, and the emitted light may be white or other colors.

In the organic layer 33 is configured by laminating a hole injection layer, a hole transport layer, a light emitting layer, an electron transport layer, and an electronic injection layer, not shown, for example, in order from the pixel electrode layer 32 side. A laminate structure of the organic layer 33 is not limited to this example, but the laminate structure is not specified if at least the light emitting layer is included.

The light emitting layer is made of an organic electroluminescent material that emits light by coupling holes with electrons. The organic electroluminescent material of this type which is generally used, for example, as an organic light emitting material may be used.

The counter electrode layer 34 is formed to cover the organic layer 33 in the overall display area D. With the provision of this configuration, the counter electrode layer 34 contacts in common to the organic layers 33 of the plural organic EL elements 30 in the display area D.

The counter electrode layer 34 is made of a material having translucency and conductivity. Specifically, it is preferable that the counter electrode layer 34 is made of, for example, ITO. Alternatively, the pixel counter electrode layer 34 may be made of a conductive metal oxide such as ITO or InZnO mixed with metal such as silver or magnesium, or a laminate of a metal thin film made of silver or magnesium and a conductive material oxide.

An upper surface of the counter electrode layer 34 is covered with a transparent sealing film 40 made of an insulating material over the plural pixels P. The sealing film 40 covers the overall substrate 10 to prevent moisture from penetrating into the respective layers including the organic layer 33.

An upper surface of the sealing film 40 is covered with the counter substrate 50 through a filler 45 made of, for example, an inorganic material. The counter substrate 50 is arranged to face the substrate 10. The counter substrate 50 is formed of, for example, an insulating substrate, and a configuration of the counter substrate 50 is not particularly restricted.

Subsequently, a description will be given of a configuration of the organic EL display device 1a in the frame area E. As illustrated in FIGS. 1 and 2, the frame area E represents an area around the outer periphery $D_1$ of the display area D. Hereinafter, for convenience of the description, the outer periphery of the frame area E is called "outer periphery F".

The frame area E is different from the display area D at least in that the organic EL element 30 is not formed, and a trench portion (first trench portion) 20 is formed. Hereinafter, it is assumed that an area closer to the display area D side than the first trench portion 20 is called "auxiliary area $E_1$", an area in which the first trench portion 20 is formed is called "first trench area $E_2$", and an area on the outer periphery F side in the area around the first trench area $E_2$ is called "first peripheral area $E_2$".

The auxiliary area $E_1$ is an area between the display area D and the first trench area $E_2$. With the provision of the auxiliary area $E_1$, a step between the display area D and the first trench area $E_2$ is eliminated.

In the auxiliary area $E_1$, on the substrate 10 are laminated the gate insulating layer 11b, the interlayer insulating film 11e, the first insulating layer 12, the first patterning layer 13, the pixel separation film 14, the second patterning layer 32, the electrode layer (counter electrode layer) 34, and the sealing film 40 on each other in the stated order. An end of the organic layer 33 is located between the outer periphery $D_1$ of the display area D, and a boundary of the auxiliary area $E_1$ and the first trench area $E_2$.

Then, the first peripheral area $E_3$ will be described. For convenience of the description, a configuration of the first trench area $E_2$ will be described later. The first peripheral area $E_3$ is an area electrically isolated from the display area D. The first peripheral area $E_3$ is different from the auxiliary area $E_1$ in that the pixel separation film 14 is not formed between the first patterning layer 13 and the second patterning layer 32.

Subsequently, the first trench area $E_2$ will be described. The first trench portion 20 is provided for forming a first overhang structure $O_1$ to be described later as well as an electrode pattern. The first trench area $E_2$ is formed, for example, along the outer periphery $D_1$ of the display area D. A portion where the first trench portion 20 is formed is not limited to the above example. The first trench area $E_2$ may be disposed along only two opposed sides in a plan view in the outer periphery $D_1$ rectangular in the plan view.

In the first trench area $E_2$, the gate insulating layer 11b and the interlayer insulating film 11e are laminated, for example, on the substrate 10. The upper surface of the interlayer insulating film 11e forms a bottom surface 21a of the first trench portion 20. Also, the electrode layer 34 and the sealing film 40 are laminated on the bottom surface 21a.

The first trench portion 20 is formed by removing a part of at least the electrode layer 34, the second patterning layer 32, and the first patterning layer 13. A depth of the first trench portion 20 in a thickness direction of the substrate 10 is not particularly restricted, but a height from the upper surface 10a of the substrate 10 to the bottom surface 21a has only to be lower than at least a height from the upper surface 10a to an upper surface 12b of the first insulating layer 12. The first trench portion 20 according to the first embodiment is obtained by, for example, removing the electrode layer 34, the second patterning layer 32, the first patterning layer 13, and the first insulating layer 12.

Also, it is preferable that a ground 111d is exposed to the bottom surface 21a of the first trench portion 20. The ground 111d is provided to keep a constant potential of the electrode layer 34 formed within the first trench portion 20. The ground 111d is connected to the electrode layer 34 and the line not shown in the first trench portion 20. The ground 111d according to this embodiment is made of, for example, the same material as that of the source/drain electrode 11d in the display area D, and formed in the same layer. However, the configuration of the ground 111d is not particularly restricted.

Then, the overhang structure (first overhang structure) $O_1$ within the first trench portion 20 will be described. The first overhang structure $O_1$ is a structure to electrically isolate the electrode layer 34 in the display area D from the electrode layer 34 (electrode film 334) in the first peripheral area $E_3$. Also, the first overhang structure $O_1$ is a uneven structure formed by an end 13a of the first patterning layer 13, and an end 32a of the second patterning layer 32.

With the formation of the first overhang structure $O_1$, the electrode layer 34 (electrode film 134) formed in the auxiliary area $E_1$ is divided from the electrode layer 34 (electrode film 234) formed in the first trench area $E_2$. With this configuration, the electrode layer 34 in the display area D and the electrode film 134 in the auxiliary area $E_1$ are electrically isolated from the electrode film 234 in the first trench area $E_2$.

Likewise, the electrode film 234 in the first trench area $E_2$ and the electrode layer 34 (electrode film 334) formed in the first peripheral area $E_3$ are divided from each other due to the first overhang structure $O_1$. For that reason, the electrode film 334 in the first peripheral area $E_3$ is electrically isolated from the electrode film 234 in the first trench area $E_2$.

Figure 3:
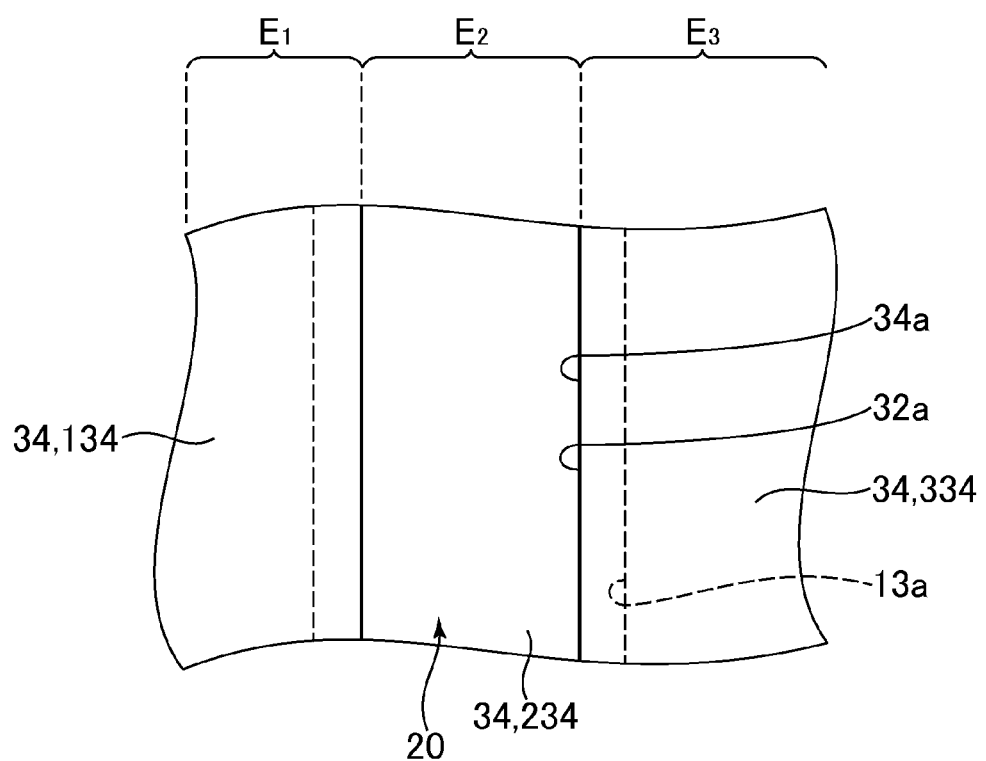
FIG. 3 is a partially enlarged view of an area III of the organic EL display device illustrated in FIG. 1.

FIG. 3 is a partially enlarged view of an area III of the organic EL display device illustrated in FIG. 1. For convenience of the description, in FIG. 3, the counter substrate 50, the filler 45, and the sealing film 40 are omitted from illustration. As illustrated in FIGS. 2 and 3, the end 13a of the first patterning layer 13 exposed within the first trench portion 20 is located outside of the end 32a of the second patterning layer 32 in a plan view. For that reason, the end 13a of the first patterning layer 13 does not come in contact with the electrode layer 34.

With the above configuration, the electrode layer 34 (electrode film 234) formed within the first trench portion 20 (first trench area $E_2$) which is located on a lower side of the end 13a of the first patterning layer 13 is isolated from the electrode layer 34 (electrode films 134, 334) formed in the periphery (auxiliary area $E_1$ and first peripheral area $E_3$) of the first trench portion 20 which is located on an upper side of the end 13a of the first patterning layer 13. In this embodiment, "upper side" represents a direction of the counter substrate 50 side when viewed from the substrate 10, and "lower side" represents a direction of the substrate 10 side when viewed from the counter substrate 50.

With the provision of the above configuration, the electrode layer 34 (electrode film 234) formed in the first trench area $E_2$ is electrically isolated from the electrode layer 34 formed in the display area D and the auxiliary area $E_1$. Also, with this configuration, the electrode layer 34 in the display area D is electrically isolated from the electrode layer 34 (electrode film 334) in the first peripheral area $E_3$.

The end 13a of the first patterning layer 13 has only to be located outside of at least the end 32a of the second patterning layer 32 in the plan view. As illustrated in FIG. 2, the end 13a of the first patterning layer 13 is located outside of an inner peripheral surface 21 of the first trench portion 20 in the plan view. With the provision of this configuration, as compared with the organic EL display device without the provision of this configuration, the electrode layer 34 is more surely isolated (divided) through the first overhang structure $O_1$ therebetween.

In the organic EL display device 1a according to this embodiment, the second patterning layer (pixel electrode layer) 32 and the electrode layer (counter electrode layer) 34 is isolated (divided) on a portion where the first overhang structure $O_1$ is formed. For that reason, as compared with the conventional organic EL display device having the electrode layer formed with the use of the mask, an improvement in the precision and miniaturization of the pattern of the electrode layer 34 can be realized.

Also, because a current path in the electrode layer 34 is divided through the first overhang structure $O_1$ therebetween, an improvement in the precision of the pattern of the divided portion of the current path is also improved. For that reason, the narrowing and an improvement in the reliability of the organic EL display device 1a can be realized.

Also, in the organic EL display device 1a according to this embodiment, the first insulating layer 12 and the organic layer 33 each made of organic material are not formed in the first trench area $E_2$. With this configuration, as compared with the organic EL display device without the provision of this configuration, even if moisture penetrates from the first peripheral area $E_3$ side, moisture is prevented from penetrating in the first trench area $E_2$. For that reason, the moisture diffusion toward the display area D side can be prevented.

Figure 4:
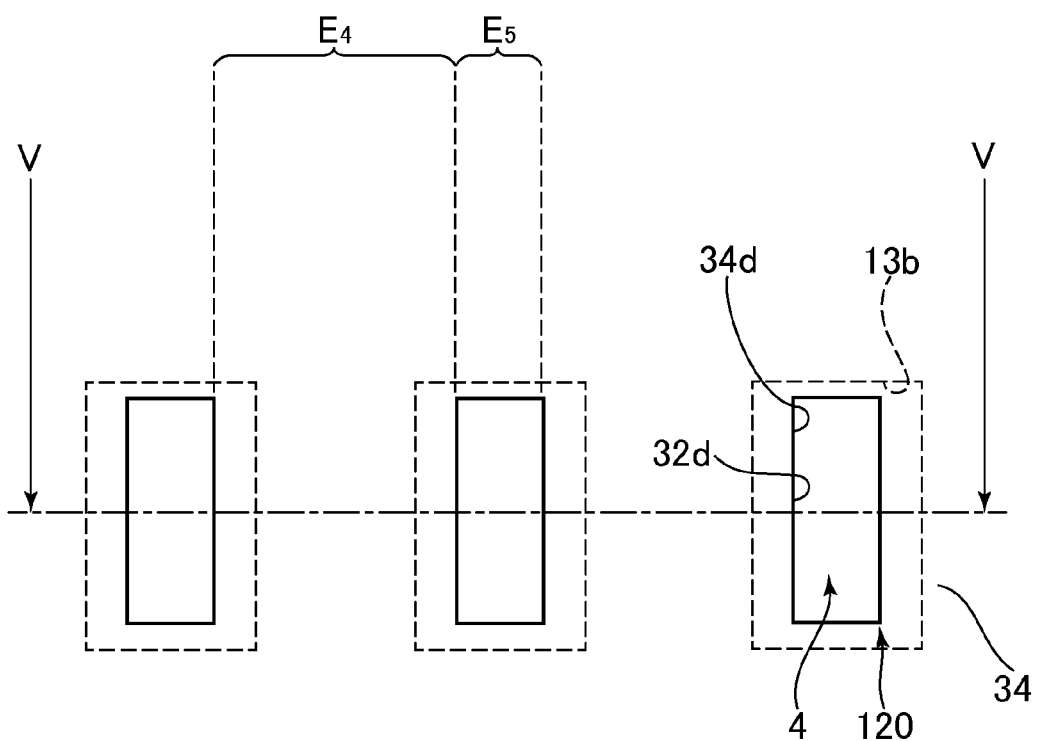
FIG. 4 is a partially enlarged view of an area IV of the organic EL display device illustrated in FIG. 1.
Figure 5:
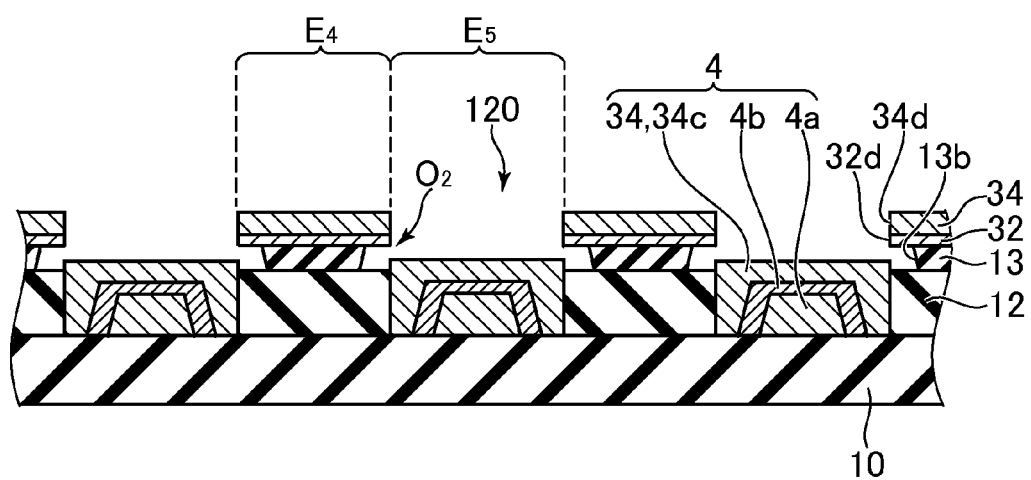
FIG. 5 is a schematic cross-sectional view taken along a line V-V illustrated in FIG. 4.

The portion in which the overhang structure is formed is not limited to the above example, but may be formed to surround the first terminals 4 and the second terminals 5. FIG. 4 is a partially enlarged view of an area IV of the organic EL display device 1a illustrated in FIG. 1, and FIG. 5 is a schematic cross-sectional view taken along a line V-V illustrated in FIG. 4. Hereinafter, the area around the first terminals 4 will be described in detail.

The respective first terminals 4 are formed in plural trench portions (second trench portions) 120 aligned at intervals from each other. The second trench portions 120 are trenches provided for configuring a second overhang structure $O_2$ which will be described later. Hereinafter, for convenience of the description, it is assumed that an area around the second trench portions 120 is called "second peripheral area $E_4$", and an area in which the second trench portions 120 are formed is called "second trench area $E_5$.

In the second peripheral area $E_4$, the first insulating layer 12, the first patterning layer 13, the second patterning layer 32, and the electrode layer 34 are laminated on the substrate 10 in the stated order.

The second trench portions 120 in the second trench area $E_5$ is grooves provided for configuring the second overhang structure $O_2$ which will be described later. The second trench area $E_5$ is obtained by removing, for example, the second patterning layer 32, the first patterning layer 13, and the first insulating layer 12, and the substrate 10 is exposed to the bottom surface thereof.

The first terminals 4 and the second overhang structure $O_2$ are formed within the second trench portions 120. The first terminals 4 include, for example, a wiring layer 4a, a first terminal electrode 4b that covers the first terminals 4, and a second terminal electrode layer 34c that covers the first terminal electrode 4b.

The wiring layer 4a is made of metal such as aluminum. The wiring layer 4a is a layer forming a base material of the first terminals 4. The first terminal electrode 4b is made of, for example, ITO. Also, the second terminal electrode layer 34c is formed in the same layer as that of the electrode layer 34 in the display area D. The first terminal electrode 4b and the second terminal electrode layer 34c are laminated on the wiring layer 4a so as to be electrically connected to the wiring layer 4a. With this configuration, the wiring layer 4a is electrically connected to an IC chip 3 through the first terminal electrode 4b and the second terminal electrode layer 34c.

The second overhang structure $O_2$ is a uneven structure for electrically separating the second terminal electrode layer 34c in the second trench area $E_5$ from the electrode layer 34 in the second peripheral area $E_4$. The second overhang structure $O_2$ includes an end 13b of the first patterning layer 13, and an end 32d of the second patterning layer 32.

As illustrated in FIGS. 4 and 5, the end 13b of the first patterning layer 13 exposed within the second trench portions 120 is located outside of the end 32d of the second patterning layer 32 exposed within the second trench portions 120 in the plan view. With the provision of the above configuration, the end 13b of the first patterning layer 13 is prevented from being covered with the electrode layer 34 covering the second patterning layer 32 in the second peripheral area $E_4$. For that reason, the end 13b of the first patterning layer 13 is exposed within the second trench portion 120.

As described above, the end 13b of the first patterning layer 13 is formed outside of the end 32d of the second patterning layer 32 in the plan view. With this configuration, the electrode layer 34 (second terminal electrode layer 34c) formed within the second trench portions 120 (second trench area $E_5$) which is located on a lower side of the end 13b of the first patterning layer 13 is isolated from the electrode layer 34 formed in the periphery (second peripheral area $E_4$) of the second trench portions 120, which is located on an upper side of the end 13b of the first patterning layer 13.

With the provision of the above configuration, the electrode layer 34 (second terminal electrode layer 34c) formed within the second trench portions 120 (second trench area $E_5$) is electrically isolated from the electrode layer 34 formed in the second peripheral area $E_4$.

In the organic EL display device 1a according to this embodiment, with the provision of this configuration, the second overhang structure $O_2$ is formed with high precision. For that reason, even the fine first terminals 4 can be electrically isolated from the electrode layer 34 in the second peripheral area $E_4$.

The organic EL display device 1a according to this embodiment of the present invention has been described above. However, the present invention is not limited to the above embodiment. For example, the portions in which the first overhang structure $O_1$ and the second overhang structure $O_2$ are formed are not limited to the above example, but a portion in which the electrode layer 34 is to be electrically isolated may be appropriately selected.

Figure 6:
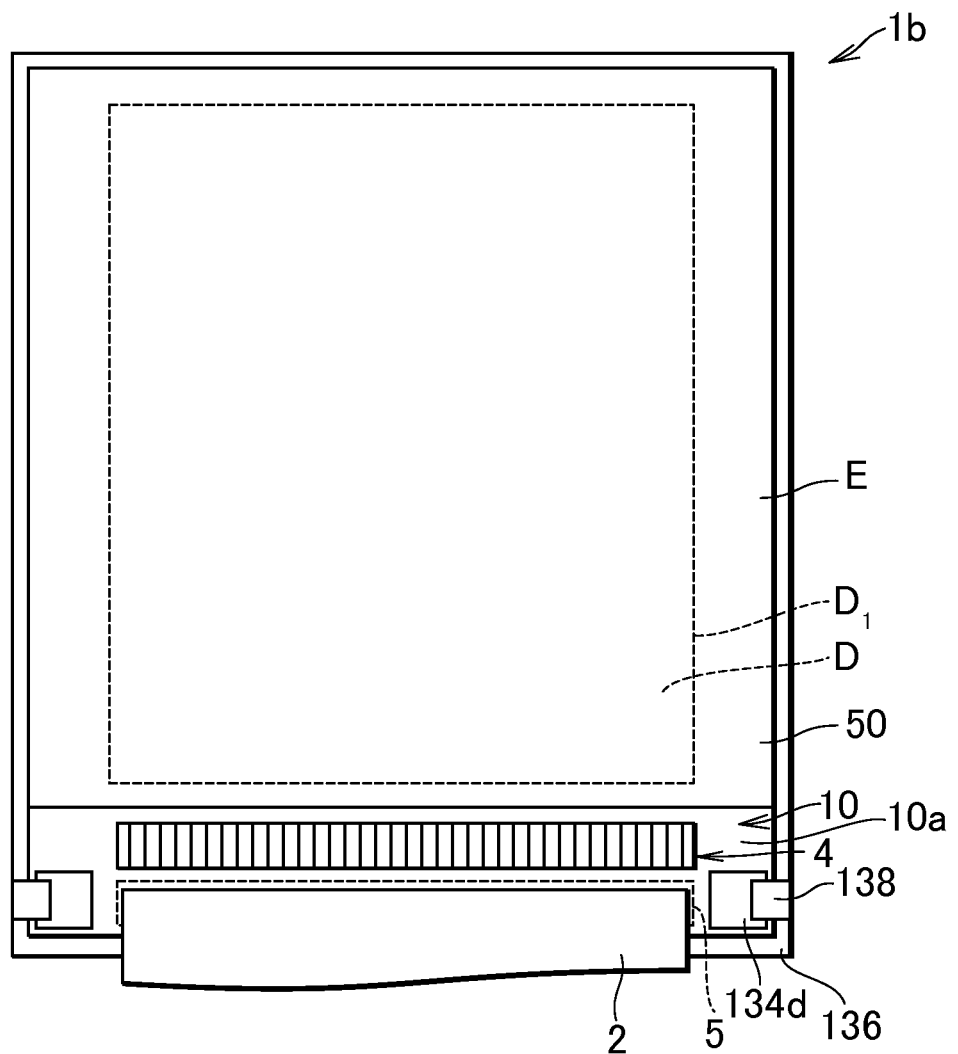
FIG. 6 is a schematic plan view of an organic EL display device according to a modification of the present invention.

Also, the ground may be formed other than the portion in which the first overhang structure $O_1$ is formed. FIG. 6 is a schematic plan view of an organic EL display device 1b according to a modification of the present invention. The organic EL display device 1b includes a conductive layer contact point (ground) 134d, a metal frame 136, and a conductive tape 138 in addition to the above organic EL display device 1a.

The conductive layer contact point 134d is electrically connected to the metal frame 136 through the conductive tape 138. The conductive layer contact point 134d is connected to the metal frame 136 to function as the ground. The metal frame 136 is a frame that supports the organic EL display device 1b.

With the provision of the above configuration, the potential of the electrode layer 34 in the frame area E is kept constant. Also, heat is diffused into the metal frame 136 from the electrode layer 34 through the conductive tape 138, as result of which as compared with the organic EL display device without the provision of this configuration, thermal storage of the electrode layer 34 is suppressed. For that reason, the reliability of the organic EL display device 1b can be improved.

Then, a description will be given of a method of manufacturing the organic EL display device 1a according to the embodiment of the present invention with reference to the accompanying drawings.

The method of manufacturing the organic EL display device 1a according to this embodiment includes the steps of forming the wiring layer 4a on the frame area E on the substrate 10, forming the thin film transistor 11 in the display area D, forming the first insulating layer 12 on the thin film transistor 11, forming the first patterning layer 13 on the first insulating layer 12, forming the second patterning layer 32 on the first patterning layer 13, forming the first trench portion 20, and forming the organic EL element 30.

Figure 7:
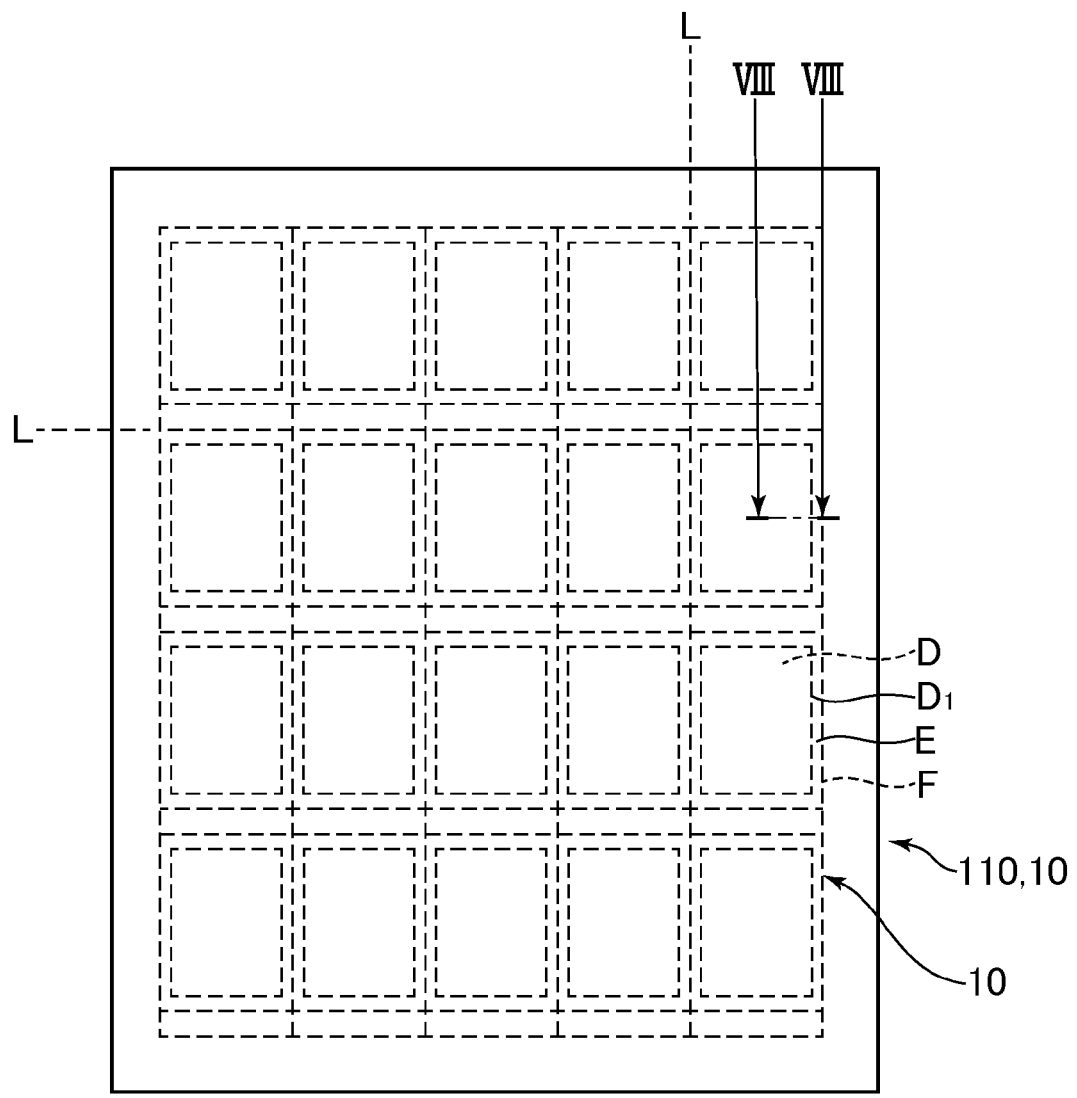
FIG. 7 is a schematic plan view illustrating a method of manufacturing the organic EL device organic EL display device illustrated in FIG. 1.

FIG. 7 is a schematic plan view illustrating a method of manufacturing the organic EL display device 1a illustrated in FIG. 1. First of all, an insulating substrate (mother substrate) 110 is prepared. The mother substrate 110 corresponds to plural substrates 10 continuous to each other. Also, in each of areas forming the substrates 10 in the mother substrate 110 are provided the rectangular display area D and the frame area E surrounding the outer periphery $D_1$ of each the display area D. The outer periphery F of the frame area E corresponds to a cut line L. The mother substrate 110 is cut along the cut line L to be singulated into plural substrates 10. Then, the wiring layer 4a is formed in the frame area E, and details of this process will be described later for convenience of the description.

Figure 8:
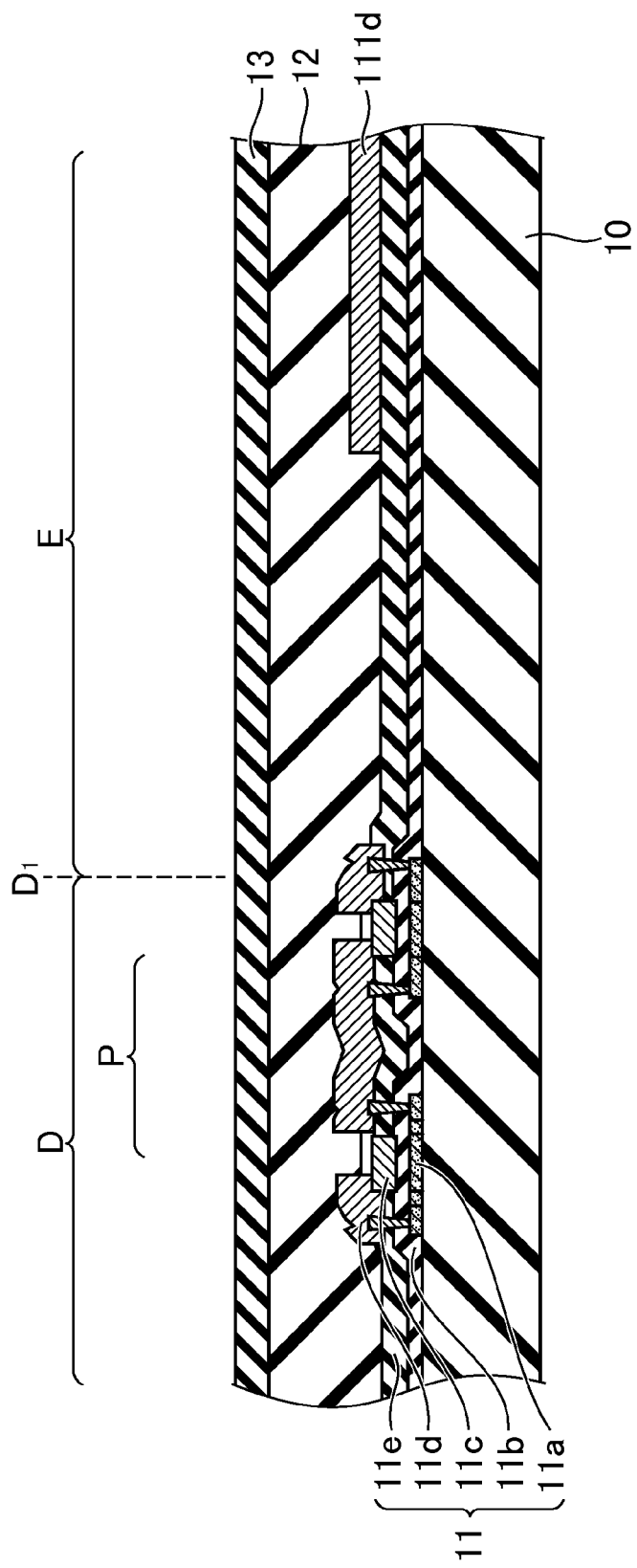
FIG. 8 is a schematic cross-sectional view taken along a line VIII-VIII illustrating the method of manufacturing the organic EL display device illustrated in FIG. 1.

FIG. 8 is a schematic cross-sectional view taken along a line VIII-VIII illustrating a method of manufacturing the organic EL display device 1a illustrated in FIG. 1. The cut line VIII-VIII corresponds to the cut line II-II in FIG. 1.

Then, in the display area D of the area (substrate 10) corresponding to the substrate 10 of the mother substrate 110, the polysilicon semiconductor layer 11a, the gate insulating layer 11b, a layer of the gate electrode 11c, a layer of the source/drain electrode 11d, and the interlayer insulating film 11e are laminated, and patterned. With this processing, the thin film transistor 11 is formed for each of the pixels P.

Also, in the above processes, in the frame area E, the gate insulating layer 11b, the layer of the source/drain electrode 11d, and the interlayer insulating film 11e are laminated on each other to form the ground 111d in the same layer as the source/drain electrode 11d.

Then, the first insulating layer 12 made of, for example, an organic material is formed to cover the thin film transistor 11 in the display area D, and the frame area E.

Figure 9:
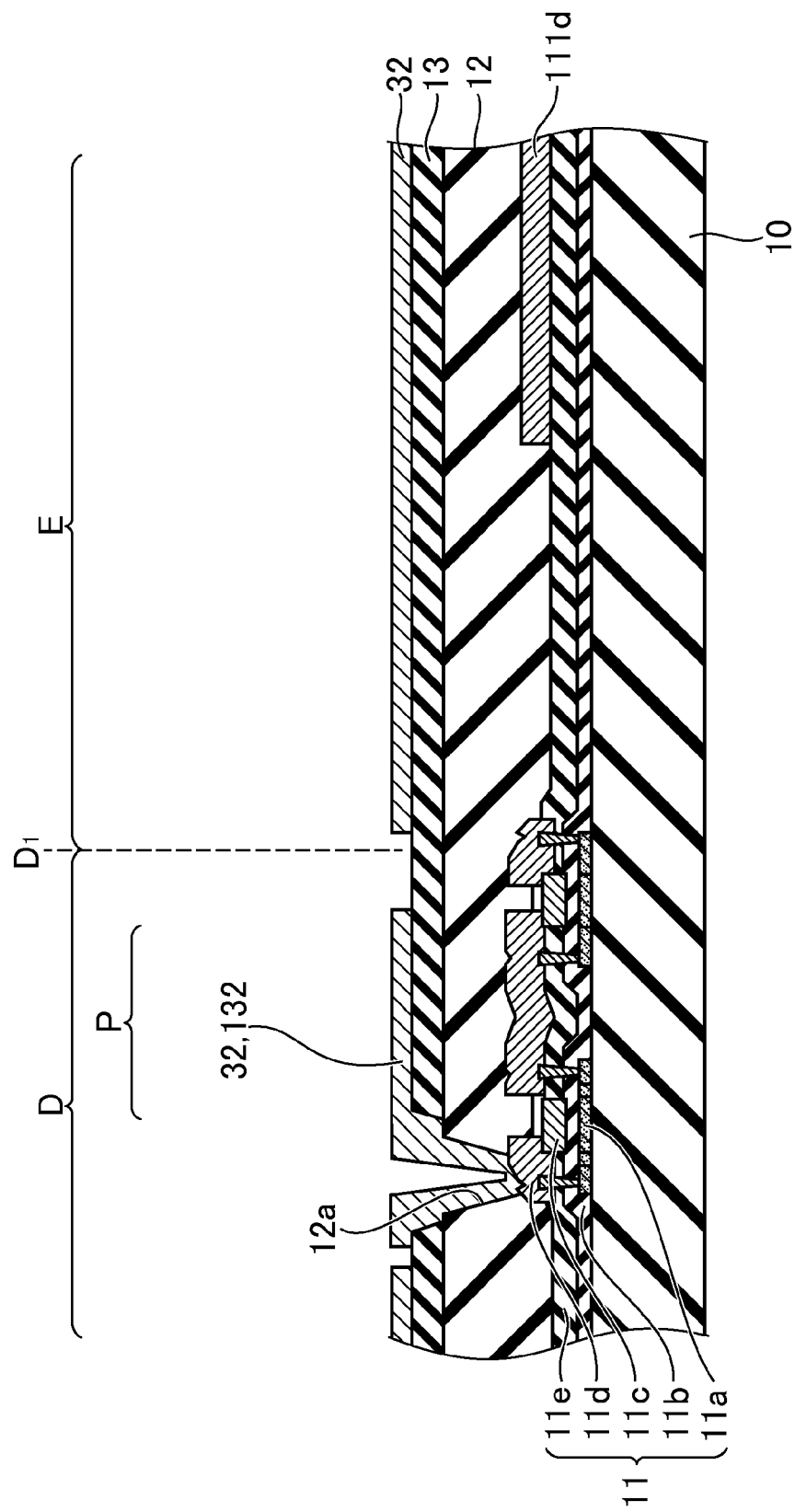
FIG. 9 is a schematic cross-sectional view taken along the line VIII-VIII illustrating the method of manufacturing the organic EL display device illustrated in FIG. 1.

FIG. 9 is a schematic cross-sectional view taken along the line VIII-VIII illustrating the method of manufacturing the organic EL display device 1a illustrated in FIG. 1. Then, the first patterning layer 13 made of an insulating material such as $SiO_2$ or SiN is laminated to cover the first insulating layer 12 over the display area D and the frame area E.

Then, the first contact hole 12a that penetrates through the first patterning layer 13 and the first insulating layer 12, which is connected to the thin film transistor 11, is formed for each of the pixels P. Thereafter, the reflecting film not shown which is formed of a metal film may be formed in areas corresponding to the respective pixels P on the first patterning layer 13.

Then, the organic EL element 30 is formed in areas corresponding to the respective pixels P over the first patterning layer 13. A process of forming the organic EL element 30 includes a process of forming the second patterning layer 32 (pixel electrode layer 132) over the first patterning layer 13, a process of forming the organic layer 33 having at least a light emitting layer on the second patterning layer 32, and a process of forming the electrode layer (opposed electrode layer) 34.

First, the second patterning layer 32 is formed to cover the first patterning layer 13. The second patterning layer 32 is made of a material having translucency and conductivity such as ITO. Hereinafter, the second patterning layer 32 formed in the display area D serves as the pixel electrode layer 132.

With the formation of the pixel electrode layer 132 for each of the pixels P, the pixel electrode layer 132 is electrically connected to the thin film transistor 11 through the contact hole 12a. When the pixel electrode layer 132 is formed to come in contact with an upper surface of the reflecting film made of metal, the reflecting film serves as a part of the pixel electrode layer 132.

Figure 10:
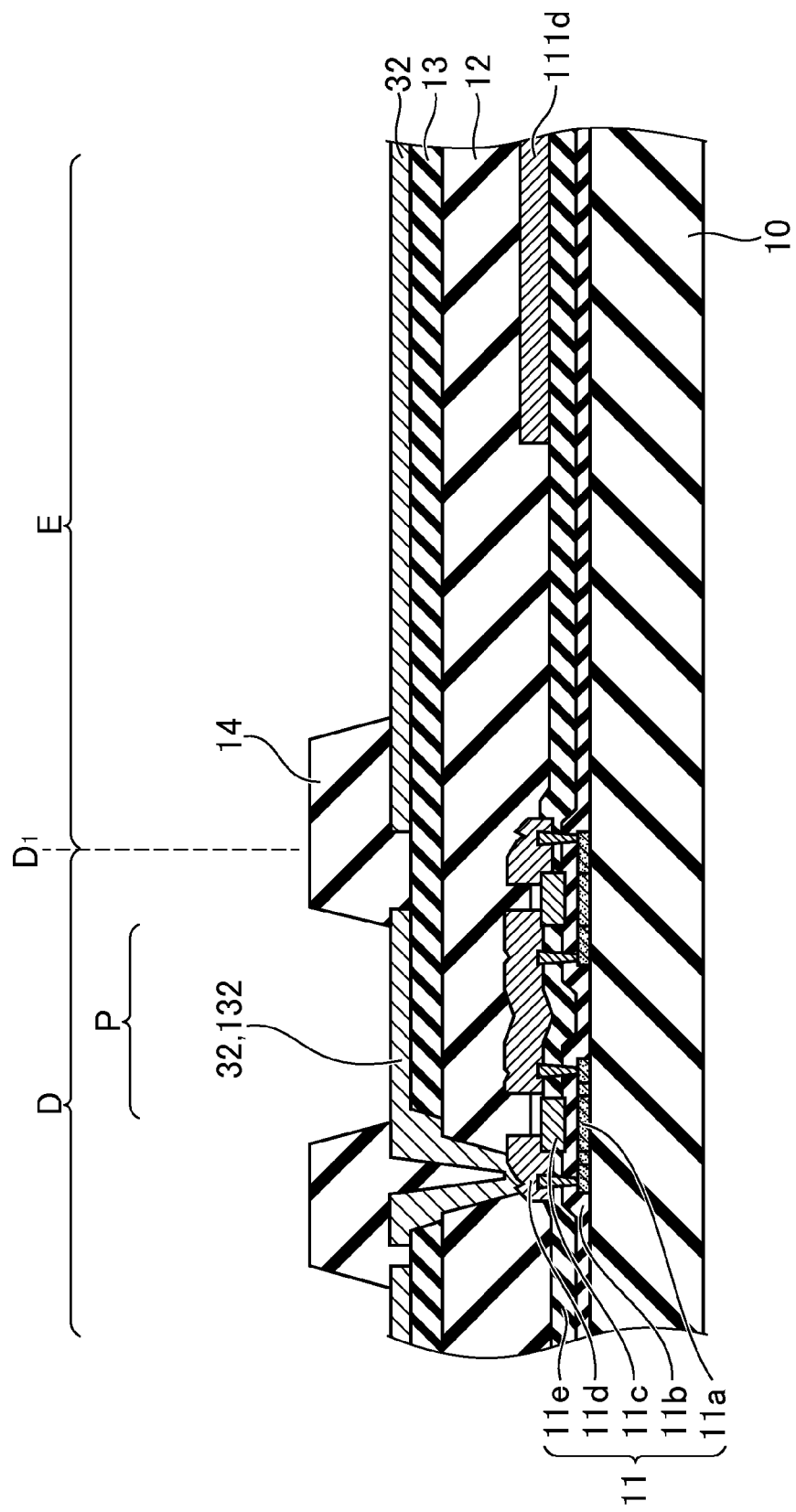
FIG. 10 is a schematic cross-sectional view taken along the line VIII-VIII illustrating the method of manufacturing the organic EL display device illustrated in FIG. 1.

FIG. 10 is a schematic cross-sectional view taken along the line VIII-VIII illustrating the method of manufacturing the organic EL display device 1a illustrated in FIG. 1. The pixel separation film 14 is formed along a boundary around the adjacent pixels P. The pixel separation film 14 may be used as the second patterning layer 32.

Figure 11:
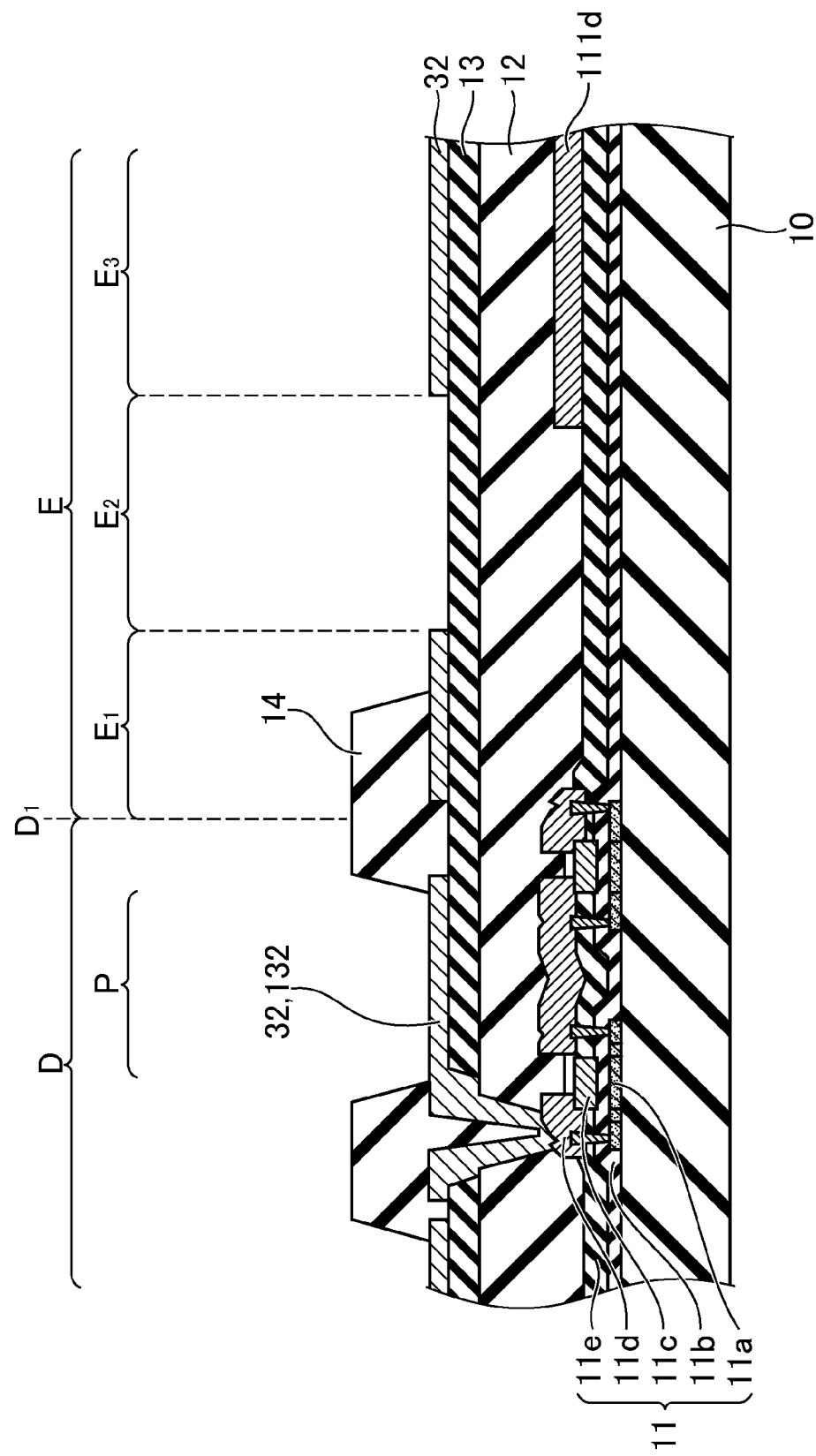
FIG. 11 is a schematic cross-sectional view taken along the line VIII-VIII illustrating the method of manufacturing the organic EL display device illustrated in FIG. 1.

FIG. 11 is a schematic cross-sectional view taken along the line VIII-VIII illustrating the method of manufacturing the organic EL display device illustrated in FIG. 1. Then, the trend portion (first trench portion) 20 is formed in the frame area E along the outer periphery $D_1$ of the display area D, for example, in the plan view.

The process of forming the first trench portion 20 includes a process of removing a part of the second patterning layer 32 in the frame area E, and a process of removing a part of the first patterning layer 13 and a part of the first insulating layer 12 by etching with the second patterning layer 32 as a mask.

First, as illustrated in FIG. 11, a part of the second patterning layer 32 in the frame area E is removed. For convenience of the description, it is assumed that the area of the frame area E in which the second patterning layer 32 is removed is the first trench area $E_2$, an area closer to the display area D than the first trench portion 20 is the auxiliary area $E_1$, and the area on the outer periphery F side in the area around the first trench area $E_2$ is the first peripheral area $E_3$. In this embodiment, the first trench area $E_2$ is formed along the outer periphery $D_1$ of the display area D, and the cut line L.

Figure 12:
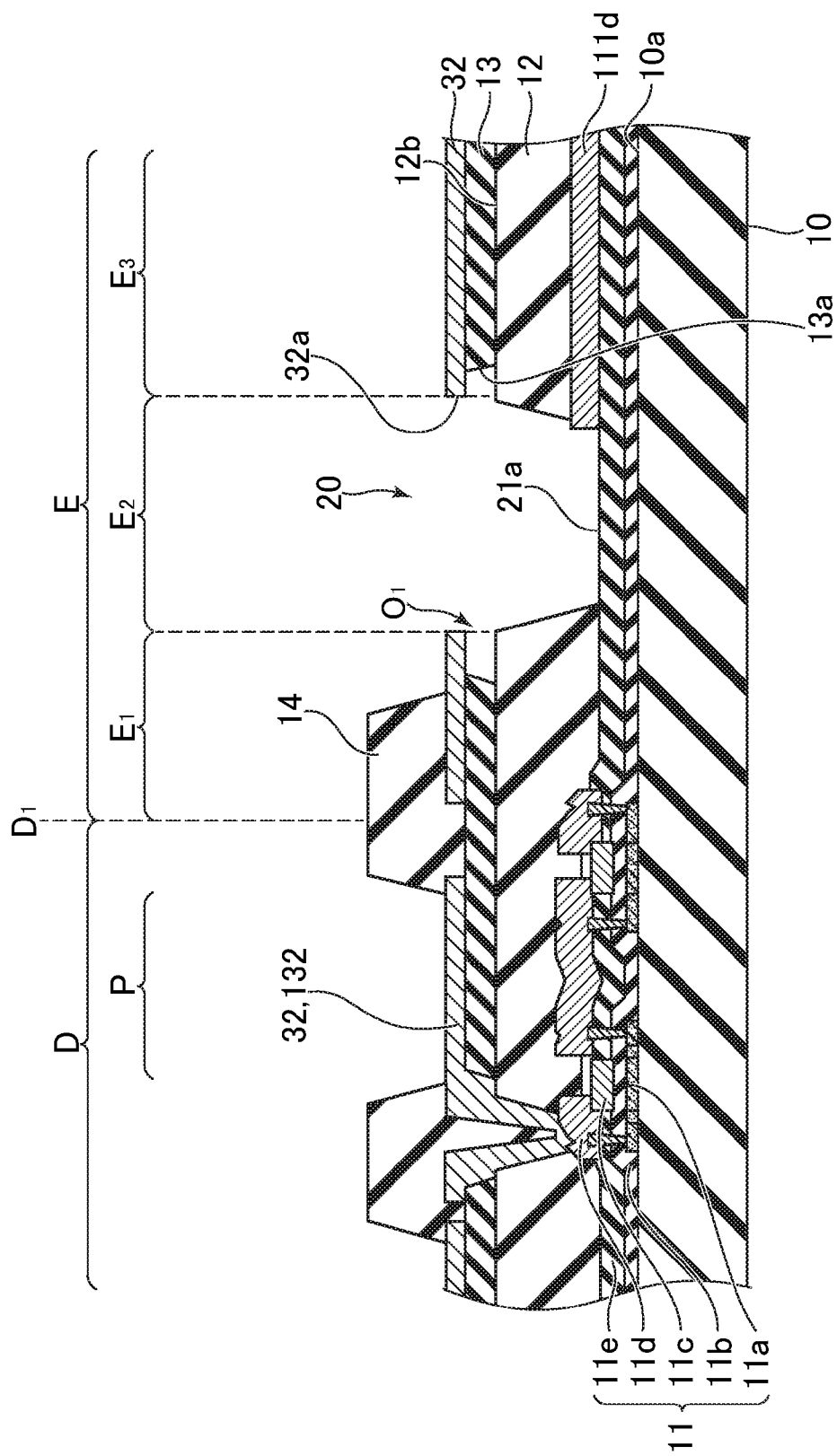
FIG. 12 is a schematic cross-sectional view taken along the line VIII-VIII illustrating the method of manufacturing the organic EL display device illustrated in FIG. 1.

FIG. 12 is a schematic cross-sectional view taken along the line VIII-VIII illustrating the method of manufacturing the organic EL display device 1a illustrated in FIG. 1. Then, etching is conducted with the second patterning layer 32 as a mask. As a result, the first trench portion 20 extending along the outer periphery $D_1$ of the display area D and the cut line L is formed.

In the formation of the first trench portion 20, the etching conditions may be adjusted so that a height from the upper surface 10a of the substrate 10 to the bottom surface 21a of the first trench portion 20 becomes lower than a height from the upper surface 10a to the upper surface 12b of the first insulating layer 12. In this embodiment, for example, the first patterning layer 13 and the first insulating layer 12 in the first trench area $E_2$ are removed to expose the interlayer insulating film 11e and the ground 111d to the bottom surface 21a of the trench portion 20.

Also, in this etching, the etching conditions are adjusted so that the end 13a of the first patterning layer 13 exposed within the trench portion 20 is located outside of the end 32a of the second patterning layer 32 exposed within the trench portion 20 in the plan view. Specifically, for example, the first patterning layer 13 is made of a material lower in etching rate than the second patterning layer 32. Also, the etching may be dry etching or wet etching, and the manner is not restricted.

The etching is conducted under the above conditions, to thereby remove the first patterning layer 13 more than the second patterning layer 32. With this configuration, the first overhang structure $O_1$ that is the uneven structure formed by the end 13a of the first patterning layer 13 and the end 32a of the second patterning layer 32 is formed.

Figure 13:
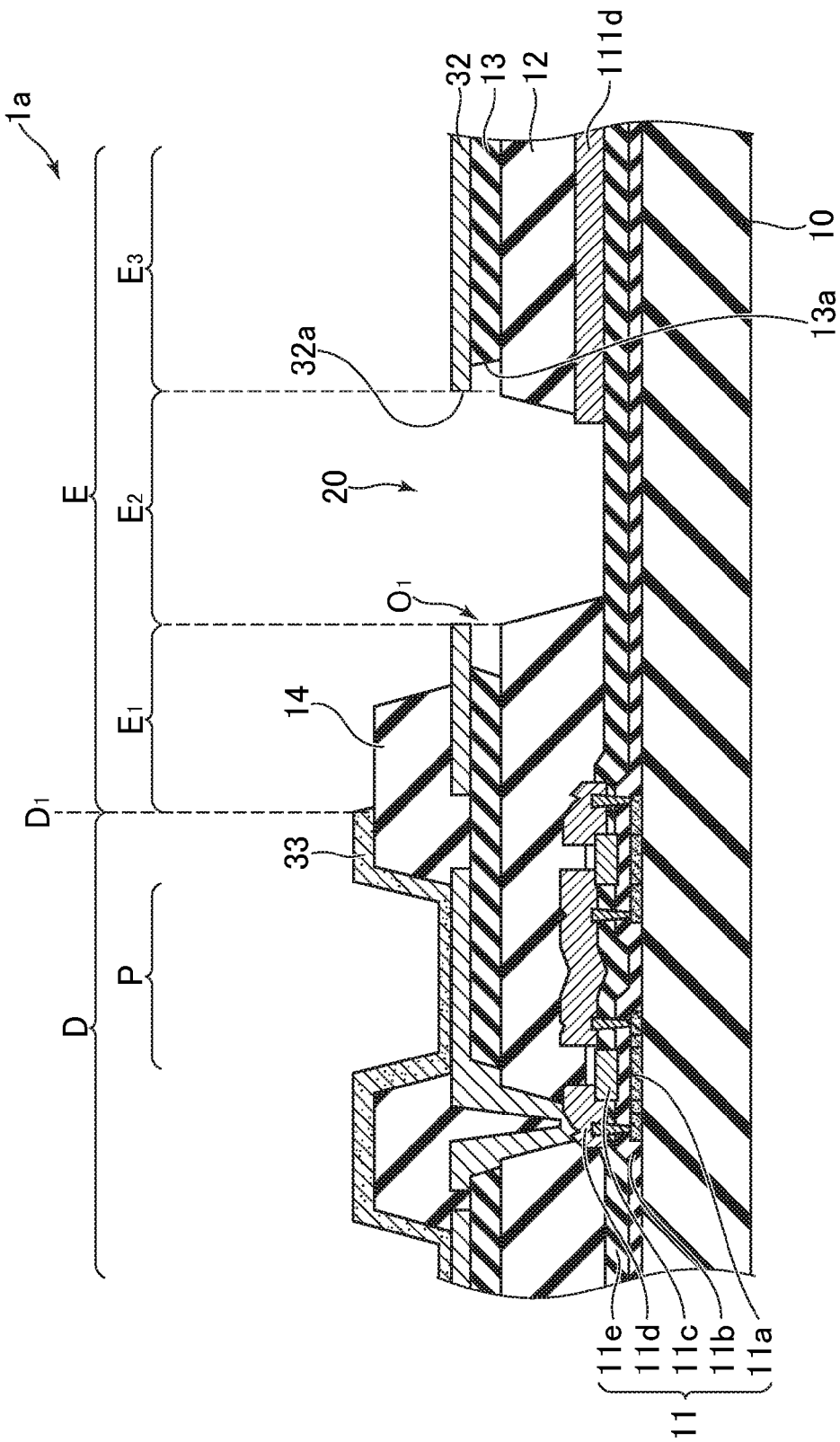
FIG. 13 is a schematic cross-sectional view taken along the line VIII-VIII illustrating the method of manufacturing the organic EL display device illustrated in FIG. 1.

FIG. 13 is a schematic cross-sectional view taken along the line VIII-VIII illustrating the method of manufacturing the organic EL display device 1a illustrated in FIG. 1. The organic layer 33 having the light emitting layer is formed to cover the display area D. Specifically, for example, the organic layer 33 is configured by laminating a hole injection layer, a hole transport layer, a light emitting layer, an electron transport layer, and an electronic injection layer, not shown, for example, in order from the pixel electrode layer 32.

Figure 17:
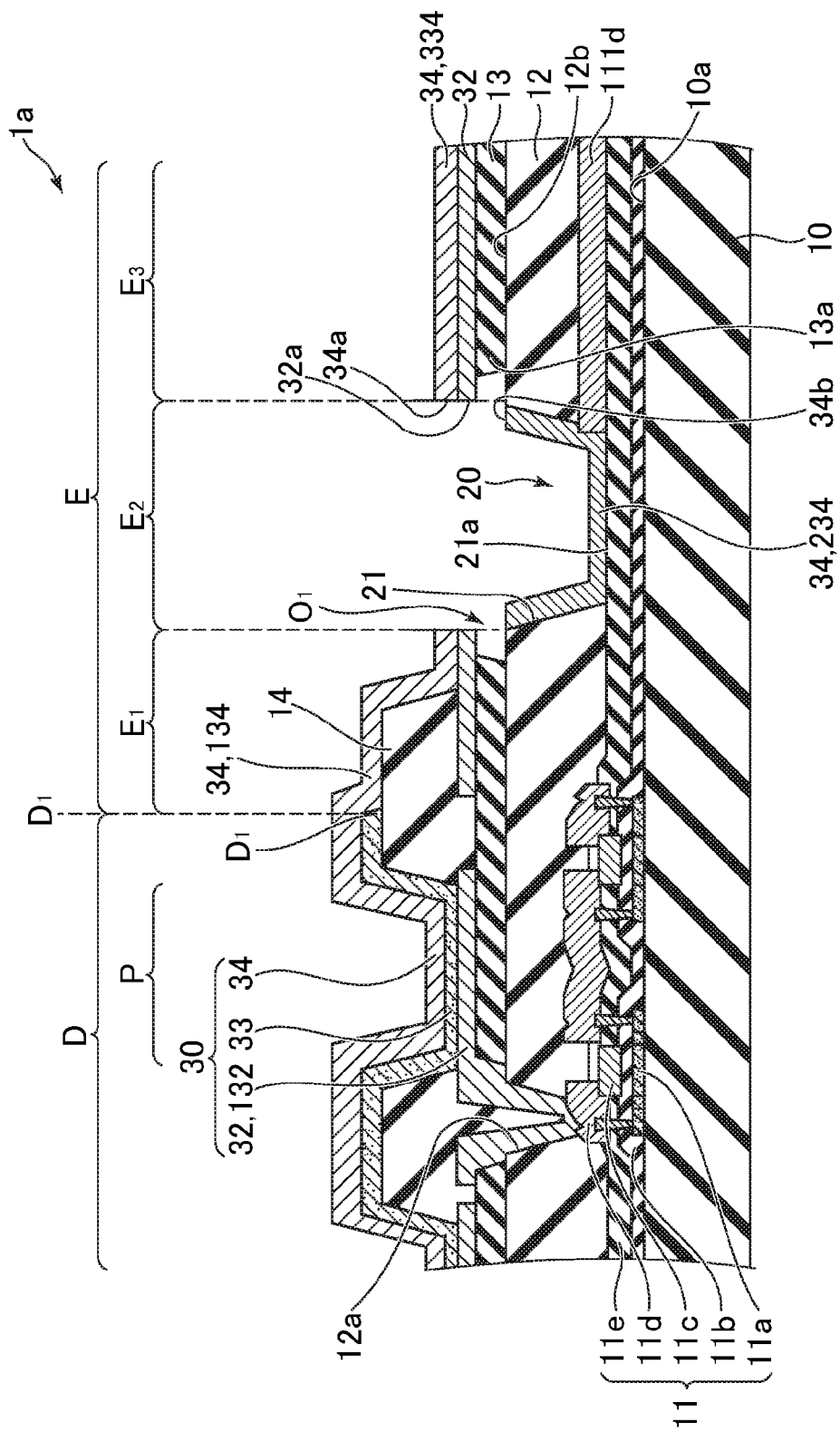
FIG. 17 is a schematic cross-sectional view taken along the line VIII-VIII illustrating the method of manufacturing the organic EL display device illustrated in FIG. 1.

Then, as illustrated in FIG. 17, a translucent conductive material such as ITO is deposited on the display area D and the frame area E to form the electrode layer 34. As a result, the electrode layer 34 formed on the display area D functions as a counter electrode layer facing the second patterning layer 32. With the above configuration, the organic EL element 30 is formed in the display area D.

Also, due to the deposition of the conductive material, the electrode layer 34 is formed to cover the second patterning layer 32 and the first trench portion 20 in the frame area E. In the frame area E, with the formation of the first overhang structure $O_1$, the electrode layer 34 (electrode film 134) formed in the auxiliary area $E_1$ is divided from the electrode layer 34 (electrode film 234) formed in the first trench area $E_2$.

Also, the electrode film 234 in the first trench area $E_2$ and the electrode layer 34 (electrode film 334) formed in the first peripheral area $E_3$ are divided from each other. The electrode layer 34 formed within the first trench portion 20 which is located on the lower side of the end 13a of the first patterning layer 13 is divided from the electrode layer 34 formed on the second patterning layer 32 in the auxiliary area $E_1$, which is located on the upper side of the end 13a.

Also, in the process of forming the electrode layer 34, the ground 111d exposed within the first trench portion 20 is covered with the electrode layer 34. As a result, the ground 111d is electrically connected to the electrode layer 34.

Then, the sealing film 40 is formed to cover the display area D and the frame area E. Then, the counter substrate 50 is arranged on the sealing film 40 through the filler 45. Then, the cut line L of the frame area E is cut along the first trench portion 20 to be singulated into the respective substrates 10. With the above processing, the organic EL display device 1a illustrated in FIG. 1 is formed.

According to the method of manufacturing the organic EL display device 1a in this embodiment, with the formation of the first overhang structure $O_1$, the electrode layer 34 can be isolated according to the portion in which the first overhang structure $O_1$ is formed without using the mask. Also, because the first overhang structure $O_1$ is formed through photolithography, as compared with the method of manufacturing the organic EL display device using the mask, the conductive pattern of the electrode layer 34 can be formed with high precision.

Also, because the pattern of the electrode layer 34 can be formed with high precision, as compared with the manufacturing method without the above configuration, the organic EL display device 1a that is reduced in size and narrow in frame can be manufactured.

Also because the electrode layer 34 can be patterned without using the mask, a reduction in the formation precision of the pattern of the electrode due to the deformation of the mask is not generated. For that reason, as compared with the manufacturing method with the use of the mask, the yield can be improved. Also, because of no use of the mask, the process can be simplified.

Also, in this embodiment, because the pixel electrode layer is used as the second patterning layer 32, the electrode layer 34 can be separated at an arbitrary portion without increasing the number of processes.

Also, in this embodiment, since the frame area E is cut along the trench portion 20, the substrate 10 can be singulated along the separation portions of the electrode layer 34. For that reason, as compared with the method of forming the pattern of the electrode layer 34 with the use of the mask, the yield can be improved.

Also, in this embodiment, since the electrode layer 34 formed within the first trench portion 20 is connected to the ground 111, the potential of the electrode layer 34 formed within the first trench portion 20 can be kept constant.

Figure 14:
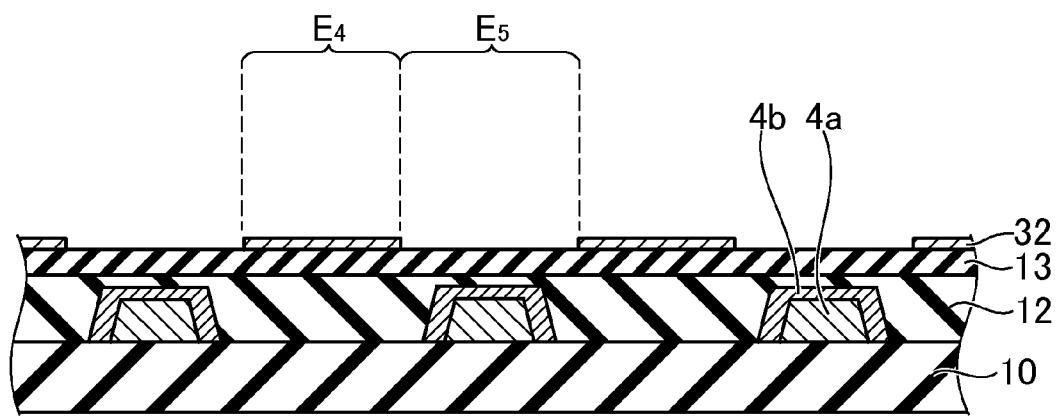
FIG. 14 is a schematic cross-sectional view taken along a line V-V illustrating the method of manufacturing the organic EL display device illustrated in FIG. 1.

In this embodiment, till the process of forming electrode layer 34 in the display area D, the first terminals 4 having the electrode layer 34 is formed in the frame area E. FIG. 14 is a schematic cross-sectional view taken along a line V-V illustrating the method of manufacturing the organic EL display device illustrated in FIG. 1.

Specifically, for example, first, in the process of forming the wiring layers 4a, the wiring layers 4a extend at intervals from each other in the portion where the first terminals 4 are formed in the frame area E. Then, the first terminal electrode 4b made of a translucent conductive material such as ITO is formed to cover the wiring layer 4a.

Then, in the process of removing a part of the second patterning layer 32 in the frame area E illustrated in FIG. 11, as illustrated in FIG. 14, the second patterning layer 32 in an area corresponding to the wiring layer 4a is removed by, for example, etching. Hereinafter, for convenience of the description, it is assumed that the area in which the second patterning layer 32 has been removed by etching is the second trench area $E_5$, and the area between the second trench areas $E_5$ adjacent to each other is the second peripheral area $E_4$.

Figure 15:
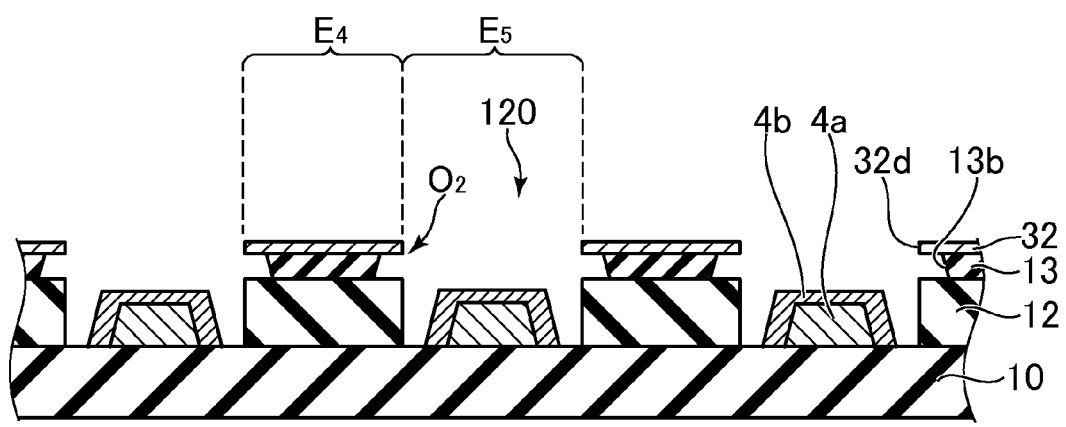
FIG. 15 is a schematic cross-sectional view taken along the line V-V illustrating the method of manufacturing the organic EL display device illustrated in FIG. 1.

FIG. 15 is a schematic cross-sectional view taken along the line V-V illustrating the method of manufacturing the organic EL display device illustrated in FIG. 1. Then, in the process of forming the first trench portion 20 illustrated in FIG. 12, as illustrated in FIG. 14, the first terminal electrode 4b is exposed by etching with the second patterning layer 32 in the second peripheral area $E_4$ as the mask. With this processing, the plural trench portions (second trench portions) 120 aligned at spaces from each other are formed in the second trench area $E_5$.

In the formation of the second trench portions 120, the etching condition is adjusted so as to remove the first patterning layer 13 more than the second patterning layer 32. With this configuration, the end 13b of the first patterning layer 13 exposed within the second trench portions 120 is located outside of the end 32d of the second patterning layer 32 exposed within the second trench portions 120 in the plan view. With this configuration, the overhang structure $O_2$ that is the uneven structure formed by the end 13b of the first patterning layer 13 and the end 32d of the second patterning layer 32 is formed.

Then, in the process of forming the electrode layer 34 so as to cover the display area D and the frame area E illustrated in FIG. 17, as illustrated in FIG. 5, the electrode layer 34 is formed to cover the second peripheral area $E_4$ and the second trench area $E_5$. In this situation, since the overhang structure $O_2$ is formed within the second trench portions 120, the electrode layer 34 is formed to cover the second patterning layer 32 in the second peripheral area $E_4$ and the terminal electrode 4b in the second trench area $E_5$ without covering the end 13b of the first patterning layer 13.

With the above configuration, the electrode layer 34 (second terminal electrode layer 34c) formed within the second trench portions 120 in the second trench area $E_5$, which is located on the lower side of the end 13b of the first patterning layer 13 is isolated from the electrode layer 34 formed on the second patterning layer 32 in the second peripheral area $E_4$, which is located on the upper side of the end 13b.

With the above configuration, the first terminals 4 electrically isolated from the electrode layer 34 in the second peripheral area $E_4$ is formed within the second trench portions 120.

In the method of manufacturing the organic EL display device 1a according to this embodiment, as compared with the method of manufacturing the organic EL display device without the provision of this configuration, the conductive pattern of the electrode layer 34 can be formed with high precision. For that reason, the first terminals 4 can be formed with a precise pattern.

The embodiments of the present invention has been described above. However, the present invention is not limited to the above embodiments. For example, the configuration described in the above-mentioned embodiment may be replaced with substantially the same configuration, the configuration having the same advantages, or the configuration that can achieve the same purpose.

Figure 16:
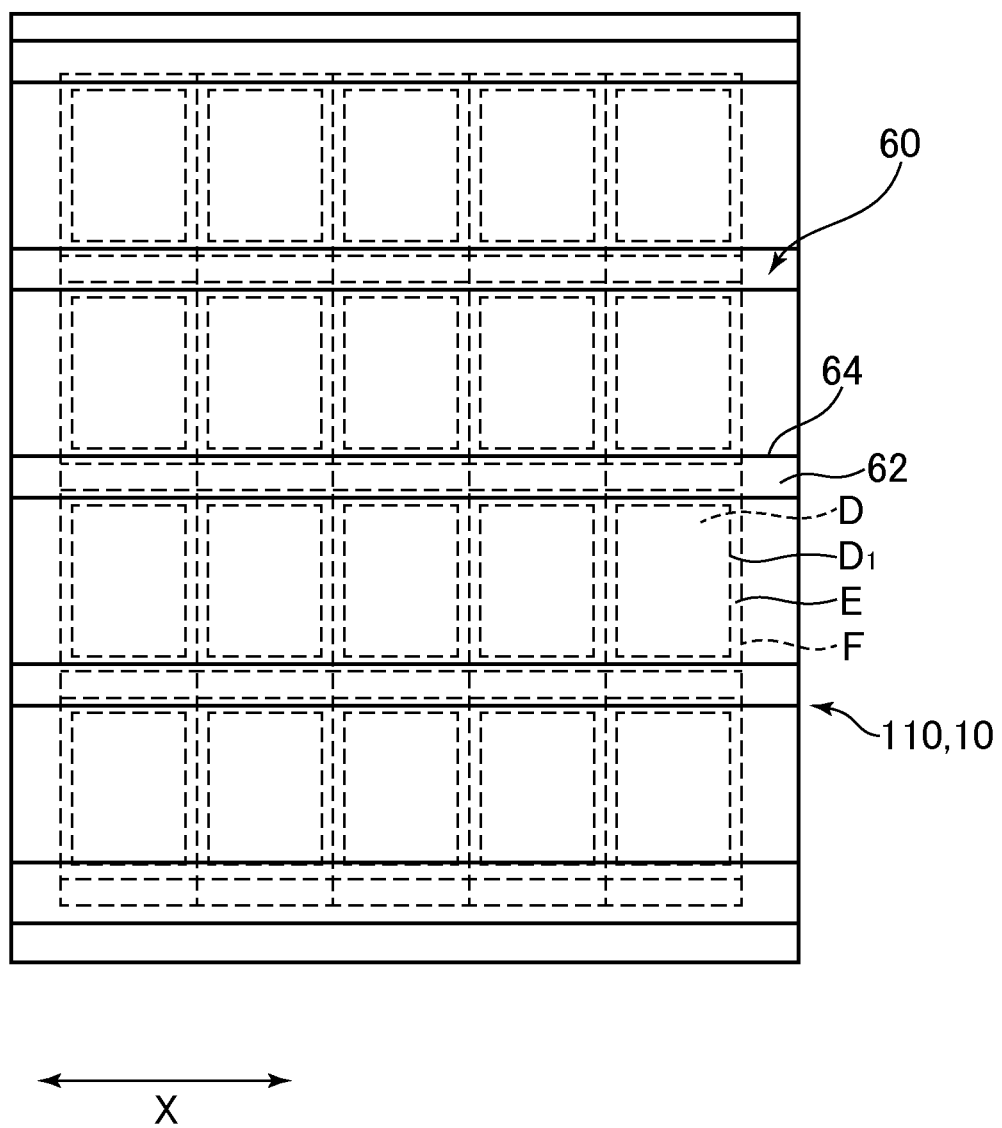
FIG. 16 is a schematic plan view illustrating a state in which a mask is arranged on a mother substrate illustrating the method of manufacturing the organic EL display device illustrated in FIG. 1.

For example in the process of forming the electrode layer 34, only a part of the electrode layer 34 may be patterned with a mask. FIG. 16 is a schematic plan view illustrating a state in which a mask 60 is arranged on the mother substrate 110 illustrating the method of manufacturing the organic EL display device 1a illustrated in FIG. 1.

Specifically, for example, in the process of forming the electrode layer 34, a material of the electrode layer 34 is deposited on the second patterning layer 32 with the use of the mask 60 having a shielding portion 62 extending only in one direction X in correspondence with the part of the frame area E, and openings 64 opened over the plural display areas D. In this embodiment, the shielding portion 62 is arranged in correspondence with the area in which the first terminals 4 are formed. With this configuration, an area in which the electrode layer 34 is not formed is formed in a part of the frame area E (formation area of the first terminals 4).

In the method of manufacturing the organic EL display device 1a according to this embodiment, because the electrode layer 34 is formed with the use of the mask 60 allowing the shielding portion 62 to extend in only one direction X, as compared with the method using a lattice-shaped mask, the deformation of the mask 60 is suppressed. For that reason, even if the width of the frame area E is reduced, a deterioration of the precision in the pattern of the electrode layer 34 can be prevented.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A method of manufacturing an organic electroluminescent display device, comprising the steps of:
    forming a first insulating layer on a substrate having a rectangular display area and a frame area which surrounds an outer periphery of the display area;
    forming a first patterning layer on the first insulating layer;
    forming a second patterning layer on the first patterning layer;
    forming a trench portion by removing a part of the second patterning layer in the frame area and undercutting a part of the first patterning layer in the frame area; and
    forming an electrode layer on the second patterning layer and in the trench portion, wherein
    in the step of forming the trench portion, an end of the first patterning layer exposed within the trench portion is etched to an outside more than an end of the second patterning layer exposed within the trench portion in a plan view, and an overhang structure is formed by the first patterning layer and the second patterning layer,
    in the step of forming the electrode layer, the electrode layer is formed on the first patterning layer and within the trench portion, and the electrode layer which is formed on the first patterning layer is isolated from the electrode layer which is formed within the trench portion,
    a plurality of the display areas is arrayed in a matrix on the substrate,
    the trench portion is formed along an outer periphery of the display area in the plan view, and
    the frame area is cut along the trench portion after the electrode layer is formed to divide the substrate into a plurality of pieces.

2. The method of manufacturing an organic electroluminescent display device according to claim 1, further comprising the step of:
    forming a ground in the frame area of the substrate before the step of forming the first insulating layer, wherein
    in the step of forming the trench portion, the ground is exposed within the trench portion, and
    in the step of forming the electrode layer, the electrode layer is connected to the ground exposed within the trench portion.

3. The method of manufacturing an organic electroluminescent display device according to claim 1, wherein
    at least a part of a plurality of the trench portions are aligned at intervals from each other, and
    in the step of forming the electrode layer, the electrode layer formed in the part of trench portion is isolated from the electrode layer formed between the part of trench portions to form the terminal having the electrode layer within the part of trench portion.

4. The method of manufacturing an organic electroluminescent display device according to claim 1,
    wherein the second patterning layer is a pixel electrode layer, and the electrode layer is a counter electrode layer facing the pixel electrode layer.

5. The method of manufacturing an organic electroluminescent display device according to claim 1,
    wherein in the step of forming electrode layer, a material of the electrode layer is deposited on the second patterning layer with the use of a mask having a shielding portion extending in only one direction in correspondence with a part of the frame area to form an area in which the electrode layer is not formed in a part of the frame area.

6. The method of manufacturing the organic electroluminescence display device according to claim 1, further comprising:
forming a second insulating layer on the electrode layer,
wherein the trench portion includes a first trench corresponding to the first patterning layer and a second trench corresponding to the second pattering layer, the second trench arranged on the first trench,
wherein a first width of the first trench is wider than a second width of the second trench,
wherein in plan view, the second trench is arranged between a first edge portion of the first trench and a second edge portion of the first trench, and
wherein the second insulating layer is arranged on the electrode layer, in the first and second edge portions of the first trench, and in the second trench.

7. The method of manufacturing the organic electroluminescence display device according to claim 6, wherein a second patterning layer doesn't cover a side surface of the first patterning layer corresponding to the first trench.

8. A method of manufacturing an organic electroluminescent display device, comprising the steps of:
forming a first insulating layer on a substrate having a rectangular display area and a frame area which surrounds an outer periphery of the display area;
forming a first patterning layer on the first insulating layer;
forming a second patterning layer on the first patterning layer;
removing a part of the second patterning layer and the first patterning layer in the frame area to form a trench portion; and
forming an electrode layer on the second patterning layer and in the trench portion, wherein
in the step of forming the trench portion, an end of the first patterning layer exposed within the trench portion is etched to an outside more than an end of the second patterning layer exposed within the trench portion in a plan view,
in the step of forming the electrode layer, the electrode layer formed within the trench portion which is located on a lower side of the end of the first patterning layer is isolated from the electrode layer formed outside of the trench portion, which is located on an upper side of the end of the first patterning layer,
a plurality of the display areas is arrayed in a matrix on the substrate,
the trench portion is formed along an outer periphery of the display area in the plan view, and
the frame area is cut along the trench portion after the electrode layer is formed to divide the substrate into a plurality of pieces.

9. The method of manufacturing an organic electroluminescent display device according to claim 8, further comprising the step of:
forming a ground in the frame area of the substrate before the step of forming the first insulating layer, wherein
in the step of forming the trench portion, the ground is exposed within the trench portion, and
in the step of forming the electrode layer, the electrode layer is connected to the ground exposed within the trench portion.

10. The method of manufacturing an organic electroluminescent display device according to claim 8, wherein
at least a part of a plurality of the trench portions are aligned at intervals from each other, and
in the step of forming the electrode layer, the electrode layer formed in the part of trench portion is isolated from the electrode layer formed between the part of trench portions to form the terminal having the electrode layer within the part of trench portion.

11. The method of manufacturing an organic electroluminescent display device according to claim 8,
wherein the second patterning layer is a pixel electrode layer, and the electrode layer is a counter electrode layer facing the pixel electrode layer.

12. The method of manufacturing an organic electroluminescent display device according to claim 8,
wherein in the step of forming electrode layer, a material of the electrode layer is deposited on the second patterning layer with the use of a mask having a shielding portion extending in only one direction in correspondence with a part of the frame area to form an area in which the electrode layer is not formed in a part of the frame area.

13. The method of manufacturing the organic electroluminescence display device according to claim 8, further comprising:
forming a second insulating layer on the electrode layer,
wherein the trench portion includes a first trench corresponding to the first patterning layer and a second trench corresponding to the second pattering layer, the second trench arranged on the first trench,
wherein a first width of the first trench is wider than a second width of the second trench,
wherein in plan view, the second trench is arranged between a first edge portion of the first trench and a second edge portion of the first trench and
wherein the second insulating layer is arranged on the electrode layer, in the first and second edge portions of the first trench, and in the second trench.

14. The method of manufacturing the organic electroluminescence display device according to claim 13, wherein a second patterning layer doesn't cover a side surface of the first patterning layer corresponding to the first trench.

* * * * *